(12) United States Patent  (10) Patent No.: US 7,732,855 B2
Park et al.  (45) Date of Patent: Jun. 8, 2010

(54) SEMICONDUCTOR MEMORY DEVICE INCLUDING RECESSED CONTROL GATE ELECTRODE

(75) Inventors: Sang-jin Park, Yongin-si (KR); Kwang-soo Seol, Suwon-si (KR); Yoon-dong Park, Yongin-si (KR); Sang-min Shin, Seoul (KR); In-jun Hwang, Yongin-si (KR); Sang-moo Choi, Yongin-si (KR); Ju-hee Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 172 days.

(21) Appl. No.: 11/808,982

(22) Filed: Jun. 14, 2007

(65) Prior Publication Data

US 2008/0093662 A1 Apr. 24, 2008

Related U.S. Application Data

(63) Continuation-in-part of application No. 11/709,860, filed on Feb. 23, 2007.

(30) Foreign Application Priority Data

Oct. 18, 2006 (KR) .................... 10-2006-0101569

(51) Int. Cl.
*H01L 21/28* (2006.01)
(52) U.S. Cl. .................. 257/316; 257/315; 257/324
(58) Field of Classification Search ........... 257/316
See application file for complete search history.

(56) References Cited

U.S. PATENT DOCUMENTS 5,045,490 A 9/1991 Esquivel et al.

(Continued)

FOREIGN PATENT DOCUMENTS

EP 0 485 018 A2 5/1992

(Continued)

OTHER PUBLICATIONS

Notice of a Search Report issued by the European Patent Office on Aug. 7, 2009, for corresponding Application No. 06125067.6-2203.

(Continued)

*Primary Examiner*—Thao X Le
*Assistant Examiner*—Geoffrey Ida
(74) *Attorney, Agent, or Firm*—Harness, Dickey & Pierce, P.L.C.

(57) ABSTRACT

A semiconductor memory device may include a semiconductor substrate, at least one control gate electrode, at least one storage node layer, at least one tunneling insulating layer, at least one blocking insulating layer, and/or first and second channel regions. The at least one control gate electrode may be recessed into the semiconductor substrate. The at least one storage node layer may be between a sidewall of the at least one control gate electrode and the semiconductor substrate. The at least one tunneling insulating layer may be between the at least one storage node layer and the at least one control gate electrode. The at least one blocking insulating layer may be between the storage node layer and the control gate electrode. The first and second channel regions may be between the at least one tunneling insulating layer and the semiconductor substrate to surround at least a portion of the sidewall of the control gate electrode and/or may be separated from each other.

20 Claims, 5 Drawing Sheets

U.S. PATENT DOCUMENTS

| | | | |
|---|---|---|---|
| 5,567,635 A * | 10/1996 | Acovic et al. | 438/259 |
| 6,025,626 A * | 2/2000 | Tempel | 257/315 |
| 6,630,708 B1 * | 10/2003 | Uchiyama | 257/316 |
| 6,720,611 B2 * | 4/2004 | Jang | 257/315 |
| 2002/0195668 A1 | 12/2002 | Endoh et al. | |
| 2005/0051830 A1 | 3/2005 | Smith | |
| 2005/0130373 A1 | 6/2005 | Choi | |
| 2005/0133851 A1 | 6/2005 | Forbes | |
| 2005/0287762 A1 | 12/2005 | Lee et al. | |
| 2006/0157753 A1 | 7/2006 | Kim et al. | |
| 2006/0170031 A1 | 8/2006 | Kang et al. | |
| 2007/0004134 A1 | 1/2007 | Vora | |
| 2007/0007581 A1 | 1/2007 | Chen et al. | |
| 2008/0023749 A1 | 1/2008 | Kim et al. | |
| 2008/0277711 A1 | 11/2008 | Sommer | |

FOREIGN PATENT DOCUMENTS

| | | |
|---|---|---|
| GB | 2380857 A | 4/2003 |
| WO | WO 2005/112119 A1 | 11/2005 |

OTHER PUBLICATIONS

Notice of a Search Report issued by the European Patent Office on Oct. 15, 2009, for corresponding Application No. 06125067.6-2203.

Office Action for U.S. Appl. No. 11/709,860, mailed on Nov. 26, 2008.

Office Action for U.S. Appl. No. 11/709,860, mailed on Jul. 14, 2009.

\* cited by examiner

SEMICONDUCTOR MEMORY DEVICE INCLUDING RECESSED CONTROL GATE ELECTRODE

CROSS-REFERENCE TO RELATED PATENT APPLICATIONS

This application is a continuation-in-part of U.S. application Ser. No. 11/709,860 filed on Feb. 23, 2007, and claims the benefit of priority under 35 U.S.C. §120 to U.S. application Ser. No. 11/709,860. The entire contents of U.S. application Ser. No. 11/709,860 is incorporated herein by reference.

PRIORITY STATEMENT

This application claims the benefit of priority to Korean Patent Application No. 10-2006-0101569, filed on Oct. 18, 2006, in the Korean Intellectual Property Office, the entire contents of which are incorporated herein in their entirety by reference.

BACKGROUND

1. Field

Example embodiments relate to a semiconductor memory device, and for example, to a semiconductor memory device including a recessed control gate electrode.

2. Description of Related Art

With recent trends toward smaller and faster devices in the semiconductor industry, semiconductor memory devices have become more highly integrated and faster in operation. Accordingly, three-dimensional (3D) semiconductor memory devices have been introduced as substitutes for conventional planar semiconductor memory devices. For example, conventional 3D semiconductor memory devices may include a recessed control gate electrode trenched into a semiconductor substrate.

If compared with conventional planar semiconductor memory devices, conventional 3D nonvolatile semiconductor memory devices have a higher channel area and a higher operating current. The higher operating current results in an increase in the speed of conventional 3D semiconductor memory devices. However, unit cells of conventional 3D semiconductor memory devices occupy larger areas and operate in one bit. Accordingly, a limitation in increasing the integration density of conventional 3D semiconductor memory devices exists.

Source and drain regions of conventional 3D semiconductor memory devices occupy larger areas. For example, negative AND (NAND)-type semiconductor memory devices that are superior in integration density are configured such that source and drain regions are alternately arranged, thereby occupying larger areas and limiting the integration density. The distribution of electric field density in conventional 3D semiconductor memory devices is not uniform, thereby decreasing reliability in program and erase operations.

SUMMARY

Example embodiments may provide a semiconductor memory device having higher integration density, higher operating speed, and/or higher reliability.

According to an example embodiment, a semiconductor memory device may include a semiconductor substrate, at least one control gate electrode, at least one storage node layer, at least one tunneling insulating layer, at least one blocking insulating layer, and/or first and second channel regions. The at least one control gate electrode may be recessed into the semiconductor substrate. The at least one storage node layer may be between a sidewall of the at least one control gate electrode and the semiconductor substrate. The at least one tunneling insulating layer may be between the at least one storage node layer and the semiconductor substrate. The at least one blocking insulating layer may be between the at least one storage node layer and the at least one control gate electrode. The first and second channel regions may be between the at least one tunneling layer and the semiconductor substrate to surround at least a portion of the sidewall of the control gate electrode, the first and second channel regions being separated from each other.

According to an example embodiment, the first and second channel regions may be separated by a pair of separating insulating layers which face each other.

According to an example embodiment, the control gate electrode may be symmetric about a line connecting the pair of separating insulating layers.

According to an example embodiment, the at least one blocking insulating layer may have a dielectric constant greater than a dielectric constant of the at least one tunneling insulating layer.

According to an example embodiment, the at least one control gate electrode may have a circular cylindrical shape.

According to an example embodiment, the at least one control gate electrode may have a radius that is inversely proportional to a difference between the dielectric constants of the at least one blocking insulating layer and the at least one tunneling insulating layer.

According to an example embodiment, the at least one storage node layer, the at least one tunneling insulating layer, and/or the at least one blocking insulating layer may be formed along the sidewall of the at least one control gate electrode.

According to an example embodiment, a thickness and the dielectric constant of the at least one blocking insulating layer may be proportional to each other.

According to an example embodiment, the at least one tunneling insulating layer may include a silicon oxide layer, and/or the at least one blocking insulating layer may include a high-k dielectric layer having a dielectric constant greater than 10.

According to an example embodiment, the semiconductor memory device may include at least one buried insulating layer between a bottom of the at least one control gate electrode and the semiconductor substrate and having a thickness greater than a thickness of the at least one tunneling insulating layer.

According to an example embodiment, the at least one storage node layer may include at least one of a polysilicon layer, a silicon nitride layer, metal or silicon dots, and metal or silicon nano-crystals.

According to an example embodiment, the at least one control gate electrode may be a plurality of control gate electrodes recessed into the semiconductor substrate. The at least one storage node layer may be a plurality of storage node layers respectively between the sidewall of each of the plurality of gate control electrodes and the semiconductor substrate. The at least one tunneling insulating layer may be a plurality of tunneling insulating layers respectively between the plurality of storage node layers and the semiconductor substrate, and adjacent tunneling insulating layers of the plurality of tunneling insulating layers may contact each other to divide the semiconductor substrate into first and second regions. The at least one blocking insulating layer may be a plurality of blocking insulating layers between the plurality of storage node layers and the plurality of control gate electrodes. The first channel region may be on each of the plurality of tunneling insulating layers in the first region of the semiconductor substrate to surround a portion of the sidewall of each of the plurality of control gate electrodes in the first region. The second channel region may be on each of the plurality of tunneling insulating layers in the second region of the semiconductor substrate to surround a portion of the sidewall of each the plurality of control gate electrodes in the second region.

According to an example embodiment, each of the plurality of blocking insulating layers may have a dielectric constant greater than a dielectric constant of each of the plurality of tunneling insulating layers.

According to an example embodiment, each of the plurality of control gate electrodes may have a circular cylindrical shape.

According to an example embodiment, each of the plurality of control gate electrodes may have a radius that is inversely proportional to a difference between the dielectric constants of each of the plurality of blocking insulating layers and each of the plurality of tunneling insulating layers.

According to an example embodiment, a thickness of each of the plurality of blocking insulating layers is proportional to the dielectric constant of each of the plurality of blocking insulating layers.

According to an example embodiment, each of the plurality of tunneling insulating layers may include a silicon oxide layer, and/or each of the plurality of blocking insulating layers may include a high-k dielectric layer having a dielectric constant greater than 10.

According to an example embodiment, the plurality of storage node layers, the plurality of tunneling insulating layers, and/or the plurality of blocking insulating layers may be formed along the sidewalls of the plurality of control gate electrodes.

According to an example embodiment, the first channel region and the second channel region may be symmetric with each other.

According to an example embodiment, the semiconductor memory device may include a plurality of buried insulating layers respectively interposed between the bottoms of the plurality of control gate electrodes and the semiconductor substrate, and each of the plurality of buried insulating layers may have a thickness greater than a thickness of each of the plurality of tunneling insulating layers.

According to an example embodiment, each of the plurality of storage node layers may include at least one of a polysilicon layer, a silicon nitride layer, metal or silicon dots, and metal or silicon nano-crystals.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Figure 1:
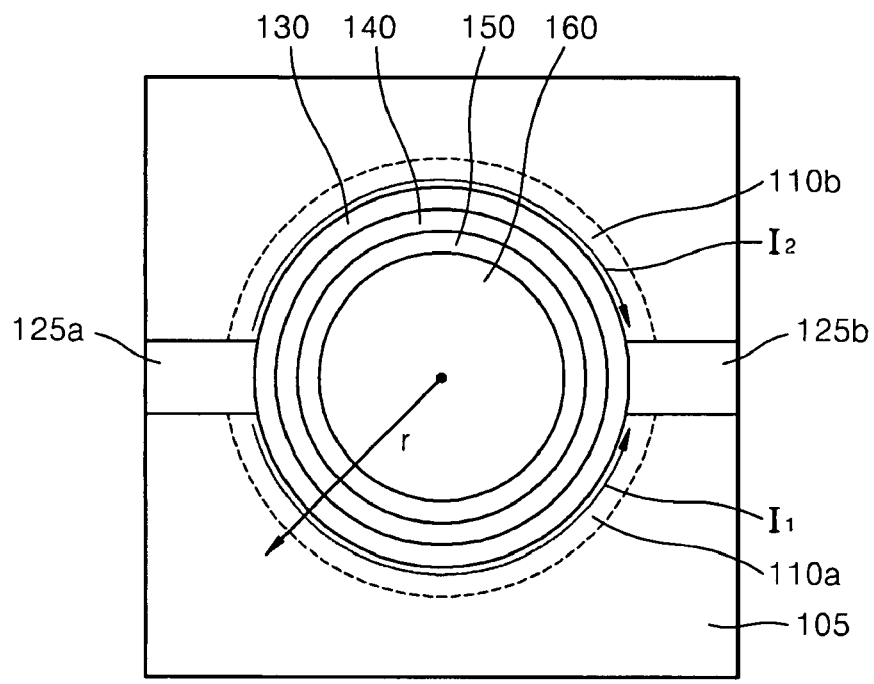
FIG. 1 is a plan view of a semiconductor memory device according to an example embodiment.

Example embodiments will now be described more fully with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Semiconductor memory devices according to example embodiments may have a three-dimensional (3D) structure. For example, semiconductor memory devices according to example embodiments may include a control gate electrode trenched into a semiconductor substrate. The control gate electrode may be referred to as a recessed control gate electrode or a trenched control gate electrode, but the scope of example embodiments is not limited to this term.

Semiconductor memory devices according to example embodiments may include nonvolatile memory devices, for example, flash memory devices.

Figure 2:
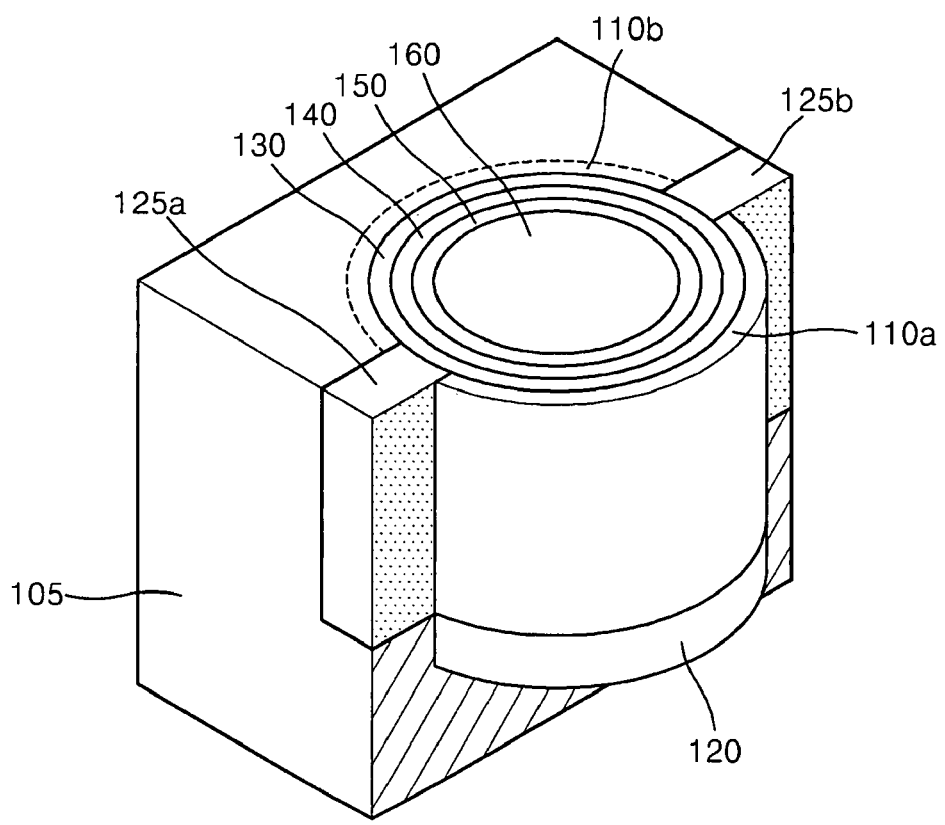
FIG. 2 is a partially cutaway perspective view of the semiconductor memory device of FIG. 1.

FIG. 1 is a plan view of a semiconductor memory device according to an example embodiment. FIG. 2 is a partially cutaway perspective view of the semiconductor memory device of FIG. 1.

Referring to FIGS. 1 and 2, the semiconductor memory device having a 3D structure may include a semiconductor substrate 105, channel regions 110a and 110b, a tunneling insulating layer 130, a storage node layer 140, a blocking insulating layer 150, and/or a control gate electrode 160. The semiconductor memory device may control the pair of channel regions 110a and 110b using the one control gate electrode 160. The pair of channel regions 110a and 110b may be separated from each other by a pair of separating insulating layers 125a and 125b. The semiconductor memory device may include a buried insulating layer 120. For example, the semiconductor memory device of FIGS. 1 and 2 may be a unit cell of a flash memory device.

The semiconductor substrate 105 may include a bulk semiconductor wafer, for example, a silicon wafer, a germanium wafer, or a silicon-germanium wafer. The semiconductor substrate 105 may include an epitaxial layer disposed on the bulk semiconductor wafer.

The control gate electrode 160 may be recessed into the semiconductor substrate 105. For example, the control gate electrode 160 may be formed by forming a hole (not shown) in the semiconductor substrate 105 and filling the hole with a conductive layer. The control gate electrode 160 may include polysilicon, metal, or metal silicide. The control gate electrode 160 may have a circular cylindrical shape and/or may induce a symmetric radial electric field. However, because current density may decrease as a distance r from the center of the control gate electrode 160 increases, the radial electric field may decrease. For example, as the radius of the control gate electrode 160 decreases, the radial electric field may increase. A change in the radial electric field, unlike a constant electric field of a planar semiconductor memory device, may significantly affect the operation of the semiconductor memory device.

Although the control gate electrode 160 has a circular cylindrical shape in FIGS. 1 and 2, example embodiments are not limited thereto, and the control gate electrode 160 may have an elliptical or polygonal cylindrical shape. If the control gate electrode 160 has an elliptical or polygonal cylindrical shape, however, a uniform radial electric field may not be achieved. However, the control gate electrode 160 may be symmetric about a line connecting the separating insulating layers 125a and 125b.

The storage node layer 140 may be interposed between a sidewall of the control gate electrode 160 and the semiconductor substrate 105. The storage node layer 140 may be used as a charge storage medium. For example, the storage node layer 140 may include a polysilicon layer, a silicon nitride layer, metal or silicon dots, or metal or silicon nano-crystals. For example, the storage node layer 140 including the silicon nitride layer, the metal or silicon dots, or the metal or silicon nano-crystals may be used as a local charge trap layer.

The tunneling insulating layer 130 may be interposed between the storage node layer 140 and the semiconductor substrate 105. The tunneling insulating layer 130 may be used as a charge tunneling path, and/or may have a thickness according to an operating voltage. For example, the tunneling insulating layer 130 may include a silicon oxide layer. The blocking insulating layer 150 may be interposed between the storage node layer 140 and the control gate electrode 160 to insulate the storage node layer 140 and the control gate electrode 160.

The tunneling insulating layer 130, the storage node layer 140, and the blocking insulating layer 150 may be formed along the sidewall of the control gate electrode 160. For example, the blocking insulating layer 150 may surround the control gate electrode 160, the storage node layer 140 may surround the blocking insulating layer 150, and/or the tunneling insulating layer 130 may surround the storage node layer 140. Accordingly, each of the tunneling insulating layer 130, the storage node layer 140, and the blocking insulating layer 150 may have a hollow cylindrical shape. For example, each of the tunneling insulating layer 130, the storage node layer 140, and the blocking insulating layer 150 may have a shape similar to the shape of the control gate electrode 160, but the shape of the tunneling insulating layer 130, the storage node layer 140, and the blocking insulating layer 150 may be hollow.

The pair of channel regions 110a and 110b may be formed on the tunneling insulating layer 130 closer to a surface of the semiconductor substrate 105, for example on a sidewall of the tunneling insulating layer 130 opposite of the storage node layer 140, to surround the sidewall of the control gate electrode 160. For example, the pair of channel regions 110a and 110b may be interposed between the tunneling insulating layer 130 and the semiconductor substrate 105. The channel regions 110a and 110b may be separated from each other by the pair of facing separating insulating layers 125a and 125b. For example, the first channel region 110a may be disposed on a first side of the separating insulating layers 125a and 125b and the second channel region 110b may be disposed on a second side of the separating insulating layers 125a and 125b. For example, the separating insulating layers 125a and 125b may be connected to the tunneling insulating layer 130, and/or may include an oxide layer, a nitride layer, or a high-dielectric constant (k) dielectric layer.

The buried insulating layer 120 may be interposed between the bottom of the control gate electrode 160 and the semiconductor substrate 105. The buried insulting layer 120 may have a thickness greater than that of the tunneling insulating layer 130 so as not to form a channel on the bottom of the semiconductor substrate 105. Accordingly, the first and second channel regions 110a and 110b may not be connected through the bottom of the semiconductor substrate 105.

The semiconductor memory device may use the first and second channel regions 110a and 110b as separate bit lines and the control gate electrode 160 as a common word line. For example, a first current $I_1$ may flow through the first channel region 110a, and/or a second current $I_2$ may flow through the second channel region Although the storage node layer 140 may have a single annular shape, portions of the storage node layer 140 facing the first and second channel regions 110a and 110b may be local charge storage layers. Accordingly, the semiconductor memory device may process 2-bit data in a single level operation. The area of the channel regions 110a and 110b may be increased by controlling the vertical depth of the channel regions 110a and 110b, thereby increasing the operating speed of the semiconductor memory device.

Because a radial electric field induced by the control gate electrode 160 may decrease as a distance r from the center of the control gate electrode 160 increases, the capacitance, which may be defined by a thickness and dielectric constant, of each of the tunneling insulating layer 130 and the blocking insulating layer 150 may affect the operation of the semiconductor memory device. Accordingly, in order to perform program and/or erase operations in the tunneling insulating layer 130 spaced apart from the control gate electrode 160, the dielectric constant of the blocking insulating layer 150 may be greater than the dielectric constant of the tunneling insulating layer 130. For example, the tunneling insulating layer 130 may include a silicon oxide layer, and/or the blocking insulating layer 150 may include a high-k dielectric layer. For example, the high-k dielectric layer may include an aluminum oxide layer, a tantalum oxide layer, a titanium oxide layer, a hafnium oxide layer, or a niobium oxide layer. Although the blocking insulating layer 150 may include a high-k dielectric layer having a dielectric constant greater than 10, for example the blocking insulating layer 150 in FIGS. 1 and 2 may have a dielectric constant greater than 10, example embodiments are not limited thereto.

As the radius of the control gate electrode 160 decreases, a change in the radial electrical field may increase. Accordingly, the radius of the control gate electrode 160 may be inversely proportional to a difference between the dielectric constants of the blocking insulating layer 150 and the tunneling insulating layer 130. For example, as the radius of the control gate electrode 160 decreases, the dielectric constant of the blocking insulating layer 150 may be increased.

Figure 5:
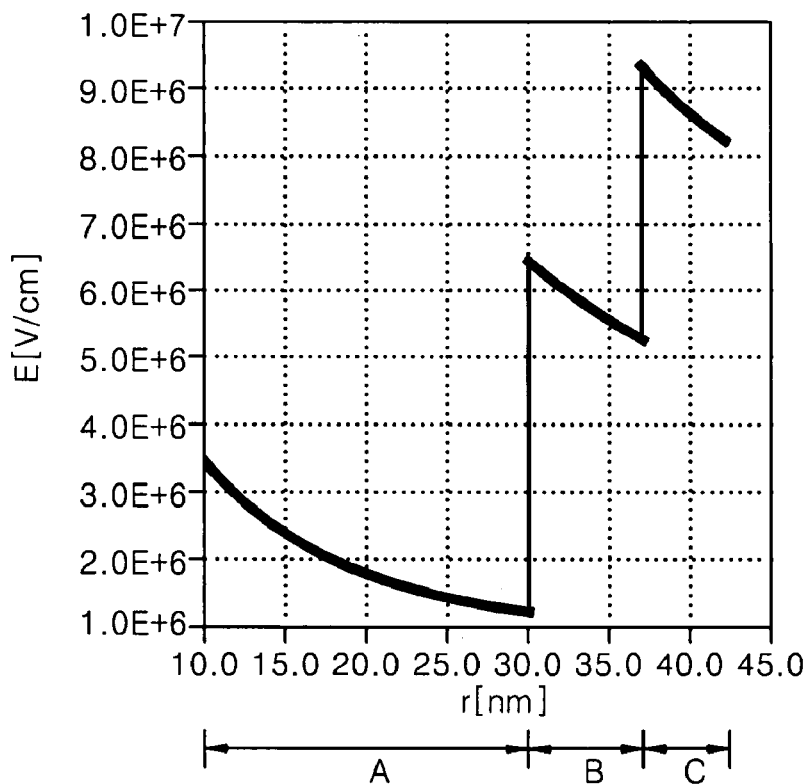
FIG. 5 is an example graph illustrating the electric field distribution of a semiconductor memory device according to an example embodiment in an example experiment.
Figure 6:
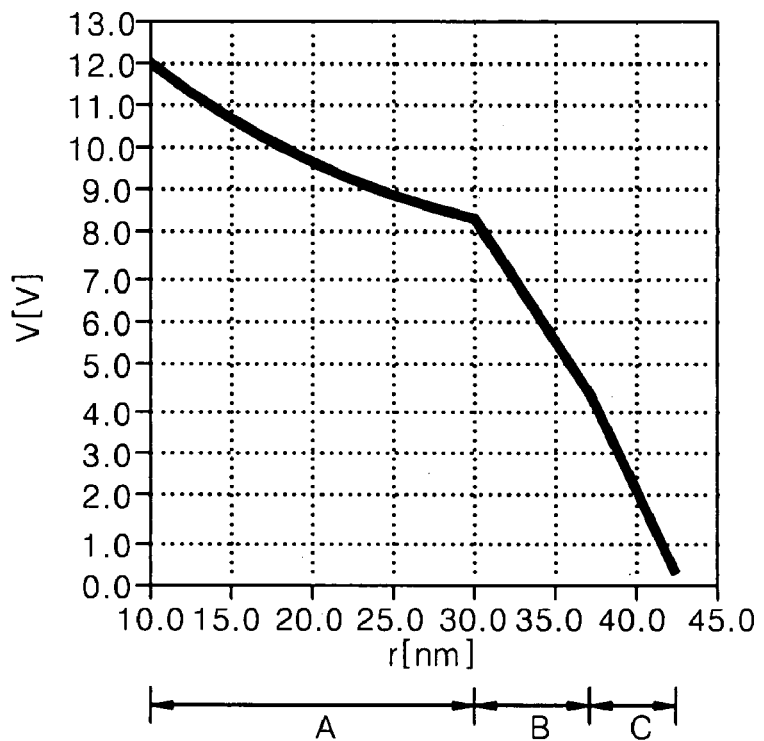
FIG. 6 is an example graph illustrating the voltage distribution of the semiconductor memory device of FIG. 5.
Figure 7:
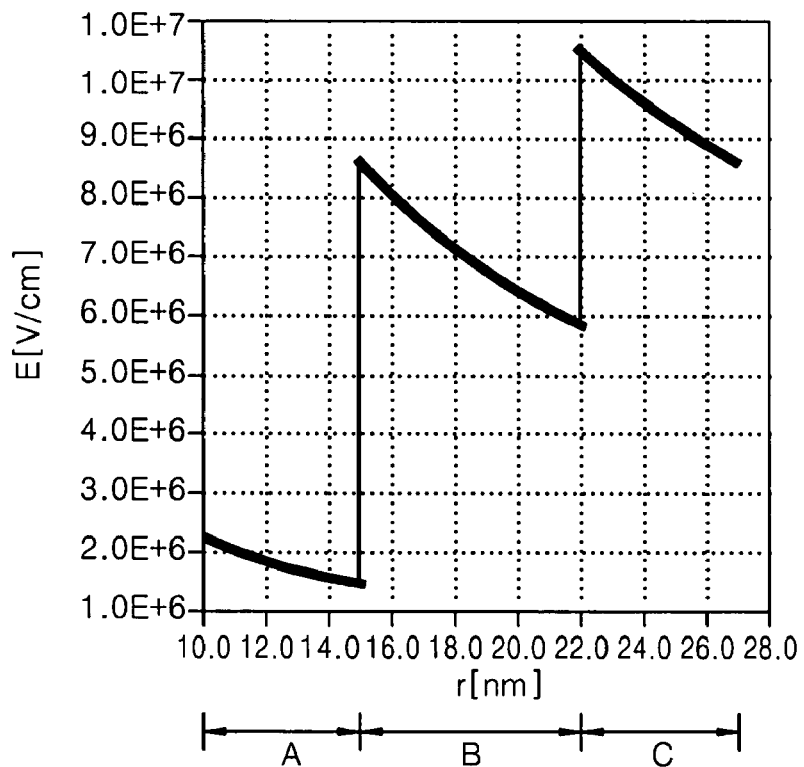
FIG. 7 is an example graph illustrating the electric field distribution of a semiconductor memory device according to another example embodiment in another example experiment.
Figure 8:
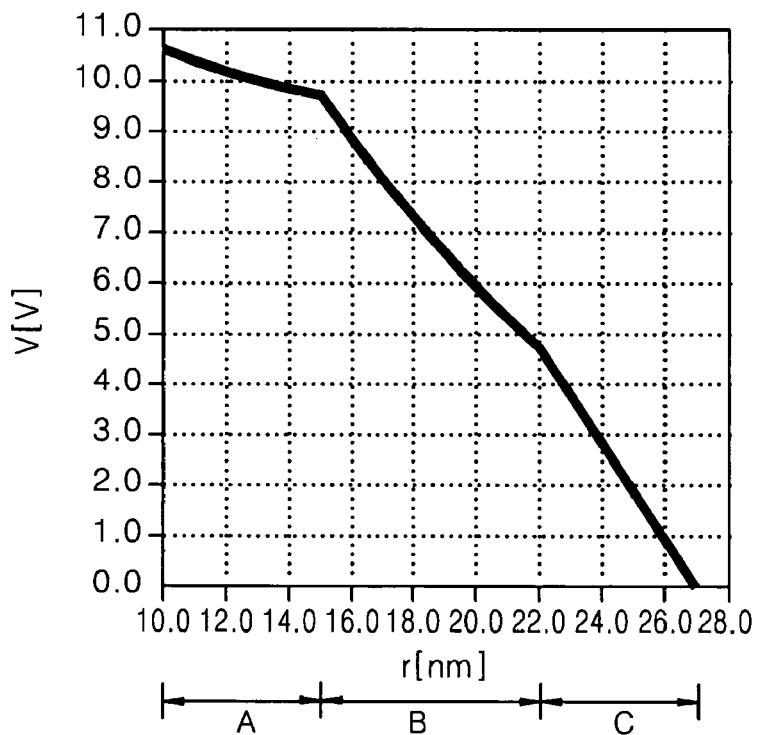
FIG. 8 is an example graph illustrating the voltage distribution of the semiconductor memory device of FIG. 7.
Figure 9:
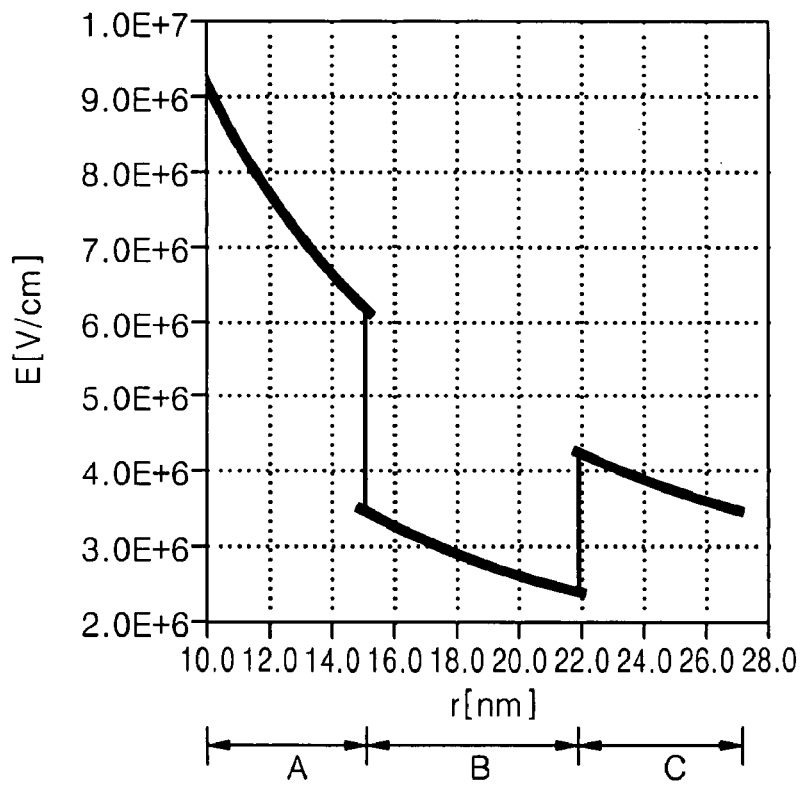
FIG. 9 is an example graph illustrating the electric field distribution of a semiconductor memory device according to an example embodiment in an example comparative experiment.
Figure 10:
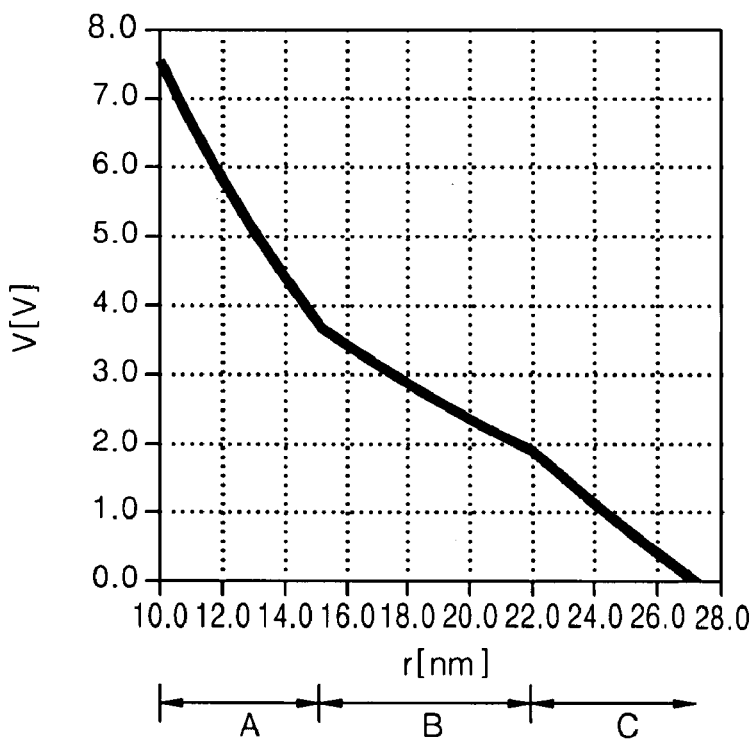
FIG. 10 is an example graph illustrating the voltage distribution of the semiconductor memory device of FIG. 9.

The voltage and electric field distribution characteristics of semiconductor memory devices according to example embodiments in example experiments and an example comparative experiment will now be explained with reference to FIGS. 5 through 10. FIGS. 5 through 10 illustrate example simulation results obtained under the following conditions. In FIGS. 5 through 10, a first region A represents a blocking insulating layer 150, a second region B represents a storage node layer 140, and a third region C represents a tunneling insulating layer 130. In FIGS. 5 through 8, the tunneling insulating layer 130 is a silicon oxide layer having a dielectric constant of approximately 3.9, and the blocking insulating layer 150 is a high-k dielectric layer having a dielectric constant of approximately 40. In FIGS. 5 and 6, the blocking insulating layer 150 has a thickness of approximately 20 nm. In FIGS. 7 and 8, the blocking insulating layer 150 has a thickness of approximately 5 nm. In FIGS. 9 and 10, each of the tunneling insulating layer 130 and the blocking insulating layer 150 is a silicon oxide layer having a dielectric constant of approximately 3.9. In FIGS. 5 through 10, the storage node layer 140 is a silicon nitride layer.

Referring to FIGS. 9 and 10 illustrating example simulation results for a semiconductor memory device according to an example embodiment in an example comparative experiment, an electric field E in the blocking insulating layer 150 may be greater than an electric field E in the tunneling insulating layer 130. An electric field E of approximately 8 to 10 MV/cm may be required to tunnel charges. However, an electric field E in the tunneling insulating layer 130 of FIGS. 9 and 10 may be approximately 3 to 4 MV/cm, thereby making it more difficult to tunnel charges through the tunneling insulating layer 130 and/or making it more difficult to perform the program and erase operations of the semiconductor memory device through the tunneling insulating layer 130. Back tunneling through the blocking insulating layer 150 may be caused, and/or dielectric breakdown may occur if a voltage V is increased.

Referring to FIGS. 5 through 8 illustrating example simulation results for semiconductor memory devices according to example embodiments in example experiments, however, an electric field E in the blocking insulating layer 150 may be less than an electric field E in the tunneling insulating layer 130. An electric field E in the tunneling insulating layer 130 may be 8 to 10 MV/cm, thereby making it easier to tunnel charges through the tunneling insulating layer 130 and/or making it easier to perform the program and erase operations of the semiconductor memory devices. In this case, a voltage V applied for the program and erase operations may range 10 to 13 V, which is less than 15 to 20 V typically required by a conventional planar semiconductor memory device. Because a lower electric field E is generated in the blocking insulating layer 150, back tunneling may be avoided.

An electric field E in the tunneling insulating layer 130 of FIGS. 5 and 6 where the blocking insulating layer 150 has the thickness of 20 nm may be lower than an electric field E in the tunneling insulating layer 130 of FIGS. 7 and 8 where the blocking insulating layer 150 has the thickness of 5 nm. Accordingly, as the thickness of the blocking insulating layer 150 increases, the dielectric constant of the blocking insulating layer 150 may be increased. For example, the thickness of and the dielectric constant of the blocking insulating layer 150 may be in proportion to each other.

Accordingly, semiconductor memory devices according to example embodiments as illustrated in example experiments may more effectively reduce back tunneling through the blocking insulating layer 150 and/or facilitate tunneling through the tunneling insulating layer 130, thereby enhancing reliability in the program and erase operations.

Figure 3:
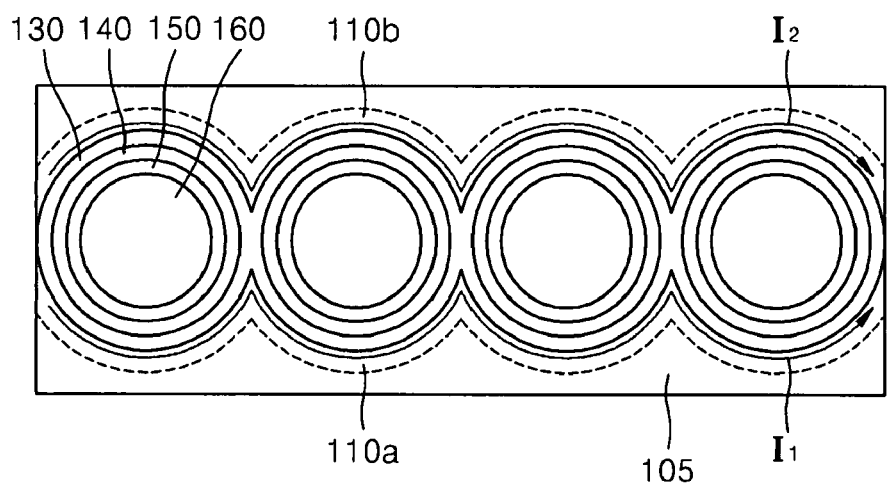
FIG. 3 is a plan view of a semiconductor memory device according to another example embodiment.
Figure 4:
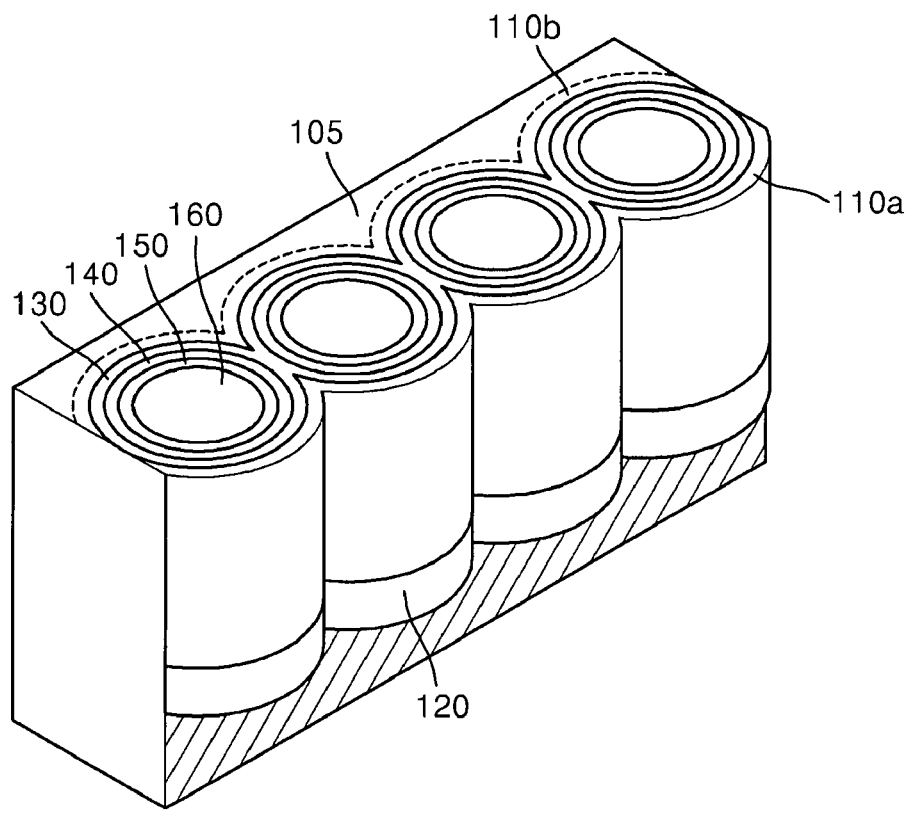
FIG. 4 is a partially cutaway perspective view of the semiconductor memory device of FIG. 3.

FIG. 3 is a plan view of a semiconductor memory device according to another example embodiment. FIG. 4 is a partially cutaway perspective view of the semiconductor memory device of FIG. 3. The semiconductor memory device of FIGS. 3 and 4 may be configured such that a plurality of unit cells, each of which is constructed similar to the semiconductor memory device of FIGS. 1 and 2, are connected in a negative AND (NAND) arrangement. The same reference numerals in FIGS. 1 through 4 denote the same elements, and thus a detailed description thereof will not be given. However, example embodiments are not limited thereto, and the semiconductor memory device of FIGS. 1 and 2 may be connected in an arrangement other than a NAND arrangement.

Referring to FIGS. 3 and 4, a plurality of control gate electrodes 160, a plurality of blocking insulating layers 150, and/or a plurality of storage node layers 140 may be separately formed in the plurality of unit cells. However, adjacent tunneling insulating layers of a plurality of tunneling insulating layers 130 may contact each other at ends thereof such that all of the tunneling insulating layers 130 are continuously connected to one another. Accordingly, a semiconductor substrate 105 may be divided into an upper region over the tunneling insulating layer 130 and a lower region under the tunneling insulating layer 130. The lower region and the upper region may be referred to as a first region and a second region, respectively, but the scope of example embodiments is not limited to the terms.

Although the tunneling insulating layers 130 of the adjacent unit cells may directly contact or overlap one another in FIGS. 3 and 4, example embodiments are not limited thereto and separating insulating layers 125a and 125b may be interposed between the tunneling insulating layers 130 as shown in FIGS. 1 and 2. Alternatively, the contact portions between the tunneling insulating layers 130 of the adjacent unit cells may act as the separating insulating layers 125a and 125b of FIGS. 1 and 2.

As the ends of the tunneling insulating layers 130 of the unit cells are connected to one another, first channel regions 110a of the unit cells in the first region of the semiconductor substrate 105 may be continuously connected to one another. Similarly, second channel regions 110b of the unit cells in the second portion of the semiconductor substrate 105 may be continuously connected to one another. Accordingly, the first channel regions 110a of the unit cells may be connected to one another without separate source and drain regions such that a first current $I_1$ may flow through the first channel regions 110a. Similarly, the second channel regions 110b of the unit cells may be connected to one another without separate source and drain regions such that a second current $I_2$ may flow through the second channel regions 110b. The first and second channel regions 110a and 110b may be symmetric with each other.

The first and second channel regions 110a and 110b of the unit cells may be connected without any separate source and drain regions because the control gate electrodes 160 may have radial electric fields. Accordingly, the semiconductor memory device of FIGS. 3 and 4 may have a NAND structure without source and drain regions, thereby occupying a smaller area than a conventional NAND-type semiconductor memory device. Accordingly, the semiconductor memory device of FIGS. 3 and 4 may have higher integration density than a conventional semiconductor memory device. Moreover, the semiconductor memory device of FIGS. 3 and 4 may process 2-bit data in a single level operation while occupying a smaller area, thereby achieving higher operating speed.

While four unit cells are shown in FIGS. 3 and 4, example embodiments are not limited thereto. Accordingly, the semiconductor memory device of FIGS. 3 and 4 may have one NAND string, and/or the number of unit cells in the one NAND string may be a desired, or alternatively, a predetermined number.

The operation of the semiconductor memory device of FIGS. 3 and 4 may be similar to the description of FIGS. 5 through 6, and the description of FIGS. 5 through 6 may be referred to.

As described above, the semiconductor memory device according to example embodiments may process 2-bit data in a single level operation, and/or may increase an operating current by controlling the vertical depth of the channel regions, thereby increasing the operating speed of the semiconductor memory device.

The semiconductor memory device according to example embodiments may have a NAND structure without source and drain regions and may occupy a smaller area than a conventional NAND-type semiconductor memory device, thereby achieving higher integration density than a conventional NAND-type semiconductor memory device.

The semiconductor memory device according to example embodiments may more effectively reduce back tunnelling through the blocking insulating layer and/or facilitate tunnelling through the tunnelling insulating layer, thereby improving reliability in the program and erase operations of the semiconductor memory device.

Although example embodiments have been shown and described in this specification and figures, it would be appreciated by those skilled in the art that changes may be made to the illustrated and/or described example embodiments without departing from their principles and spirit.

What is claimed is:

1. A semiconductor memory device, comprising:
   a semiconductor substrate;
   at least one control gate electrode recessed into the semiconductor substrate;
   at least one storage node layer between a sidewall of the at least one control gate electrode and a sidewall portion of the semiconductor substrate;
   at least one tunneling insulating layer between the at least one storage node layer and the sidewall portion of the semiconductor substrate;
   at least one blocking insulating layer between the at least one storage node layer and the at least one control gate electrode; and
   first and second channel regions between the at least one tunneling insulating layer and the sidewall portion of the semiconductor substrate;
   wherein the first and second channel regions are separated from each other,
   wherein the at least one blocking insulating layer has a dielectric constant greater than a dielectric constant of the at least one tunneling insulating layer, and
   wherein for a given control gate electrode, the first and second channel regions are separated by a pair of separating insulating layers that face each other.

2. The semiconductor memory device of claim 1, wherein for each control gate electrode, the first and second channel regions are separated by a pair of separating insulating layers that face each other.

3. The semiconductor memory device of claim 2, wherein the at least one control gate electrode is symmetric about a line connecting the pair of separating insulating layers.

4. The semiconductor memory device of claim 1, wherein the at least one control gate electrode has a circular cylindrical shape.

5. The semiconductor memory device of claim 1, wherein the at least one control gate electrode has a radius that is inversely proportional to a difference between the dielectric constants of the at least one blocking insulating layer and the at least one tunneling insulating layer.

6. The semiconductor memory device of claim 1, wherein a thickness and the dielectric constant of the at least one blocking insulating layer are proportional to each other.

7. The semiconductor memory device of claim 1, wherein the at least one tunneling insulating layer includes a silicon oxide layer, and
   wherein the at least one blocking insulating layer includes a high-k dielectric layer having a dielectric constant greater than 10.

8. The semiconductor memory device of claim 1, wherein the at least one storage node layer, the at least one tunneling insulating layer, and the at least one blocking insulating layer are formed along the sidewall of the at least one control gate electrode.

9. The semiconductor memory device of claim 1, further comprising:
- at least one buried insulating layer between a bottom of the at least one control gate electrode and the semiconductor substrate;
- wherein the at least one buried insulating layer has a thickness greater than a thickness of the at least one tunneling insulating layer.

10. The semiconductor memory device of claim 1, wherein the at least one storage node layer includes at least one of a polysilicon layer, a silicon nitride layer, metal or silicon dots, and metal or silicon nano-crystals.

11. The semiconductor memory device of claim 1, wherein the at least one control gate electrode is a plurality of control gate electrodes recessed into the semiconductor substrate,
- wherein the at least one storage node layer is a plurality of storage node layers respectively between the sidewall of each of the plurality of gate control electrodes and the semiconductor substrate,
- wherein the at least one tunneling insulating layer is a plurality of tunneling insulating layers respectively between the plurality of storage node layers and the semiconductor substrate, adjacent tunneling insulating layers of the plurality of tunneling insulating layers contacting each other to divide the semiconductor substrate into first and second regions,
- wherein the at least one blocking insulating layer is a plurality of blocking insulating layers between the plurality of storage node layers and the plurality of control gate electrodes,
- wherein the first channel region is on each of the plurality of tunneling insulating layers in the first region of the semiconductor substrate to surround a portion of the sidewall of each of the plurality of control gate electrodes in the first region, and
- wherein the second channel region is on each of the plurality of tunneling insulating layers in the second region of the semiconductor substrate to surround a portion of the sidewall of each of the plurality of control gate electrodes in the second region.

12. The semiconductor memory device of claim 11, wherein each of the plurality of blocking insulating layers has a dielectric constant greater than a dielectric constant of each of the plurality of tunneling insulating layers.

13. The semiconductor memory device of claim 12, wherein each of the plurality of control gate electrodes has a circular cylindrical shape.

14. The semiconductor memory device of claim 13, wherein each of the plurality of control gate electrodes has a radius that is inversely proportional to a difference between the dielectric constants of each of the plurality of blocking insulating layers and each of the plurality of tunneling insulating layers.

15. The semiconductor memory device of claim 12, wherein a thickness of each of the plurality of blocking insulating layers is proportional to the dielectric constant of each of the plurality of blocking insulating layers.

16. The semiconductor memory device of claim 12, wherein each of the plurality of tunneling insulating layers includes a silicon oxide layer, and
- wherein each of the plurality of blocking insulating layers includes a high-k dielectric layer having a dielectric constant greater than 10.

17. The semiconductor memory device of claim 11, wherein the plurality of storage node layers, the plurality of tunneling insulating layers, and the plurality of blocking insulating layers are formed along the sidewalls of the plurality of control gate electrodes.

18. The semiconductor memory device of claim 11, wherein the first channel region and the second channel region are symmetric to each other.

19. The semiconductor memory device of claim 11, further comprising:
- a plurality of buried insulating layers respectively interposed between bottoms of the plurality of control gate electrodes and the semiconductor substrate;
- wherein each of the plurality of buried insulating layers has a thickness greater than a thickness of each of the plurality of tunneling insulating layers.

20. The semiconductor memory device of claim 11, wherein each of the plurality of storage node layers includes at least one of a polysilicon layer, a silicon nitride layer, metal or silicon dots, and metal or silicon nano-crystals.

* * * * *